US00RE35793E

United States Patent [19]

Halpern

[11] E Patent Number: Re. 35,793

[45] Reissued Date of Patent: May 12, 1998

[54] MEASURING AND MONITORING SYSTEM

[75] Inventor: B. James Halpern, Shrewsbury, N.J.

[73] Assignee: Measuring & Monitoring Services, Inc., Tinton Falls, N.J.

[21] Appl. No.: 317,251

[22] Filed: Oct. 3, 1994

Related U.S. Patent Documents

Reissue of:

[64] Patent No.: 5,301,122
Issued: Apr. 5, 1994
Appl. No.: 836,049
Filed: Feb. 12, 1992

[51] Int. Cl.[6] ..... G01R 21/00; G06F 17/40; G08C 15/06

[52] U.S. Cl. ..... 364/483; 340/870.02; 364/464.22; 324/113

[58] Field of Search ..... 324/113; 340/635, 340/825.06, 825.07, 825.08, 870.02, 870.03; 364/464.04, 483, 550; 455/3.3, 5.1

[56] References Cited

U.S. PATENT DOCUMENTS

| | | | |
|---|---|---|---|
| 3,697,953 | 10/1972 | Schoenwitz | 340/825.16 |
| 3,927,404 | 12/1975 | Cooper | 340/518 |
| 4,161,718 | 7/1979 | Cohen et al. | 371/71 |
| 4,174,517 | 11/1979 | Mandel | 340/310.02 |
| 4,302,750 | 11/1981 | Wadhwani et al. | 340/870.02 |
| 4,315,251 | 2/1982 | Robinson et al. | 340/870.03 X |
| 4,361,851 | 11/1982 | Asip et al. | 455/5.1 X |
| 4,400,783 | 8/1983 | Locke, Jr. et al. | 364/550 X |
| 4,568,934 | 2/1986 | Allgood | 340/870.02 |
| 4,796,025 | 1/1989 | Farley et al. | 340/825.08 |
| 4,831,558 | 5/1989 | Shoup et al. | 340/550 |
| 4,835,699 | 5/1989 | Mallard | 364/470 |
| 4,902,965 | 2/1990 | Bodrug et al. | 364/483 X |
| 5,179,376 | 1/1993 | Pomatto | 340/870.02 |
| 5,268,668 | 12/1993 | Berube | 340/505 |
| 5,400,246 | 3/1995 | Wilson et al. | 364/146 |
| 5,459,459 | 10/1995 | Lee, Jr. | 340/870.02 |

*Primary Examiner*—Edward R. Cosimano
*Attorney, Agent, or Firm*—Caesar, Rivise, Bernstein, Cohen & Pokotilow, Ltd.

[57] ABSTRACT

A system for monitoring power usage of various devices at remote facilities is described. The system employs sensors at each facility to sense the on/off condition of the devices. A processor at each facility, under the control of a host computer at a central location, stores the output data of the sensors in stripped-down form. The host computer specifies to the processor at each facility the time and date at which it should begin polling the sensors, the interval between pollings of the outputs of the sensors, the time and date at which the processor should report to the host computer and transmit the stored data, and the address location to be used when the processor initiates polling of the data. A master clock/calendar at the central location is used to synchronize the clock/calendars at each facility. Thus, only stripped-down data and power outage information are required to be stored by the processor and transmitted to the host computer, without the need to store or transmit any other data such as sensor identification or time and date of polling with each sampling of data. This results in reduction of memory storage requirements and transmission time. Alternatively, rather than storing the on/off condition of the devices, sensors which generate analog currents of voltages representing the amount of power being consumed by the device can be used in conjunction with A to D converters to digitize the information for storage and transmission to the host computer.

97 Claims, 4 Drawing Sheets

FROM POWER LINE
108
WALL TRANSFORMER
10
110
POWER SUPPLY
12
112
TO ALL CIRCUITS
114
PRIMARY POWER FAIL
14
116
118
SUPERVISORY CIRCUIT
16
120
CAPACITOR BACKUP CIRCUIT
18
122
124
126
128
130
132
134
ADDRESS/DATA BUS
104
MICRO-CONTROLLER
24
142
144
RAM
26
146
CLOCK CALENDER
NOTE PAD RAM
28
29
156
MODEM
30
148
TO TELEPHONE
ADDRESS LATCH
22
140
150
INPUT BUFFERS
20
138
ISOLATION NETWORKS I1
136
A/D CONVERT
102
FROM SENSORS

MEASURING AND MONITORING SYSTEM

Matter enclosed in heavy brackets [ ] appears in the original patent but forms no part of this reissue specification; matter printed in italics indicates the additions made by reissue.

FIELD OF THE INVENTION

The present invention relates to monitoring and measurement systems, and more particularly to a monitoring and measurement system which measures and records the power usage of various devices installed at facilities, over a predetermined time period.

In recent years, with the advent of safety problems and environmental problems associated with nuclear power plants and with power plants which burn fossil fuels, electrical power utilities have opted for encouraging power conservation by their users. Thus, these utilities offer incentives such as savings on rate charges to those users who agree to change their devices for devices of greater efficiency. This not only reduces capital costs involved in the building of new power facilities, but in addition, it avoids the legal and environmental problems caused by the construction and operation of additional power facilities.

Existing devices include photoelectric or current transformers which include real time clocks and processing so that on a periodic basis, the consumption of power by the device, i.e., the amount of time the device is on and off, can be observed manually and recorded. This is troublesome because the metering devices are often in ceiling fixtures, or at other locations which are not readily accessible. Other systems contain monitoring devices which are part of complex control systems for controlling the power of a facility or a building. These existing devices and systems do not allow for the automatic sampling of the energy consuming devices and the processing and display of the information at a central point handling a large number of remote facilities with the sampling parameters such as sampling rate, sampling time period, reporting time, storage location of stored data, etc., under the control of a central host computer. Further, they do not utilize a data storage format and a protocol which result in substantial savings in equipment and communications time as does the instant system.

OBJECTS OF THE INVENTION

Accordingly, it is the general object of this invention to provide a measuring and monitoring system which overcomes the limitations of the prior art.

It is a further object of this invention to provide a measuring and monitoring system which automatically polls the on or off status of power consuming devices at a predetermined time interval as commanded by a central host computer.

It is yet a further object of this invention to provide a measuring and monitoring system which has a real time clock calendar updated by a central host computer for determining polling times.

It is still yet a further object of the instant invention to provide a measuring and monitoring system with a power fail-safe system which provides power to maintain the stored sampled information and the operation of the real time clock/calendar and status information, during power outages.

It is another object of this invention to provide a measuring and monitoring system with photocell and current transformer sensors which are self powered and which require no power source to determine whether the power consuming devices are on or off.

It is still another object of this invention to provide a measuring and monitoring system which electrically isolates the output of power sensors from the remainder of the system equipment.

It is still yet another object of this invention to provide a measuring and monitoring system which stores data received from the sensors for a predetermined time period as determined by the central host computer.

It is an additional object of this invention to provide a measuring and monitoring system with remote site storage and processing equipment which stores the polled information obtained at each remote facility at storage locations determined by the central host computer.

It is yet an additional object of this invention to provide a measuring and monitoring system with remote site storage and processing equipment which can communicate with and pass information to and from a central facility with a host computer.

It is still yet an additional object of this invention to provide a measuring and monitoring system with a host computer which receives the information stored in remote storage and processing equipment at a predetermined time and date as directed by a host computer.

It is another additional object of this invention to provide a measuring and monitoring system which has a host computer with a real time clock/calendar whose output is communicated to a remote site storage and processing equipment to synchronize the real time clock of the remote site equipment.

It is a further additional object of this invention to provide a measuring and monitoring system with a host computer which is capable of storing utility rates and sub-rates and providing formatted reports which give the energy usage and costs of each power consumption device at remote facilities over a predetermined time period.

It is yet a further additional object of this invention to provide a measuring and monitoring system which calculates and stores the amount of money saved over a specified amount of time by higher efficiency devices installed at a remote site location.

It is still yet a further additional object of this invention to provide a measuring and monitoring system which utilizes analog sensors whose outputs represent the actual power comsumption of devices at a facility and analog to digital convertors to digitize the information for storage and processing.

SUMMARY OF THE INVENTION

These and other objects of this invention are achieved by providing a measuring and monitoring system with sensors, which do not require internal or external power to operate, installed at energy consuming devices in use at remote facilities. These sensors determine whether the devices are on or off. The output of these sensors are sampled by a processor at a predetermined time interval which can be set from one minute to 99 minutes. A real time clock/calendar is used to initiate each polling of the sensors.

A unique protocol and data storage format is used which results in substantial savings in equipment and communications time.

Status and command information transmitted from a host computer at a central facility is stored in a "notepad" random access memory (RAM) at the processor at the remote facility. This status and command information is used to control the operation of the remote processor. It consists of updated real time clock calendar information, the required polling or sampling interval, and the time and date for communicating to the host computer the sampled data stored in the remote processor during the time period. In addition, the host computer commands the remote processing facility to begin storing sampled information in sequence at a specific storage location within the remote processing facility. This enables the storage of raw, stripped-down, sampled data from each of the sensors to be stored without additional information, such as identification of sensors and time, and results in considerable savings in storage requirement and in communications time.

The sensors may be photo-electric cells which determine whether lighting fixtures are on or off, or current transformers which determine whether air conditioners, heaters, electrical machinery, blowers, and the like, are on or off. Isolating circuitry is used to electrically isolate the output of sensors from the remainder of the processing equipment.

At each remote site processor facility, a modem is used to communicate with the host computer at a central location and to pass the stored information to the host computer. Each time the information is transmitted to the host computer, for example, once per week or once per two weeks, the host computer transmits real time information for updating the remote clock, the sampling rate for polling the sensors, and the time and date for the next transmission. At the designated time, the remote processor communicates with the host, transmits updated status information and passes its monitored information to the host computer.

In the preferred embodiment as presently configured, the remote equipment can provide up to thirty-two sensors at each location. The number is expandable if required. The host computer is capable of handling a large number of remote facilities. Alternatively, a small computer can be installed at a remote facility as a host computer which allows for stand-alone operation at the remote facility.

The host computer formats and processes the information received from the remote processor for display and/or printout. Thus, power consumption of each device or set of devices at each remote facility over a specified amount of time, the rate charged by the facility for usage including sub-rates for prime and nonprime time periods and seasons, and the total cost of power consumption for each device at each remote facility is determined and made available at the central facility. The system also includes a fail-safe circuit at the remote location which enables the real time clock calendar to continue to operate and which maintains the storage of the information taken from sampling of the sensors and the status information in the notepad RAM for up to twenty-four hours during power outages. As will be described below, the power outage information is stored and transmitted along with the sampled information so that the host computer may determine the amount and frequency of power outages, and keep track of the particular sensors providing the data and the time when the sampling took place. In an alternate embodiment, the on/off sensors may be replaced by analog sensors and analog-to-digital (A to D) convertors used to digitize the information representing the actual level of power usage of the device, for storage and processing by the system.

DESCRIPTION OF THE DRAWING

Other objects and many of the intended advantages of this invention will be readily appreciated when the same becomes better understood by reference to the following detailed description, when considered in connection with accompanying drawing wherein.

DETAILED DESCRIPTION OF THE PREFERRED EMBODIMENT

Figure 1:
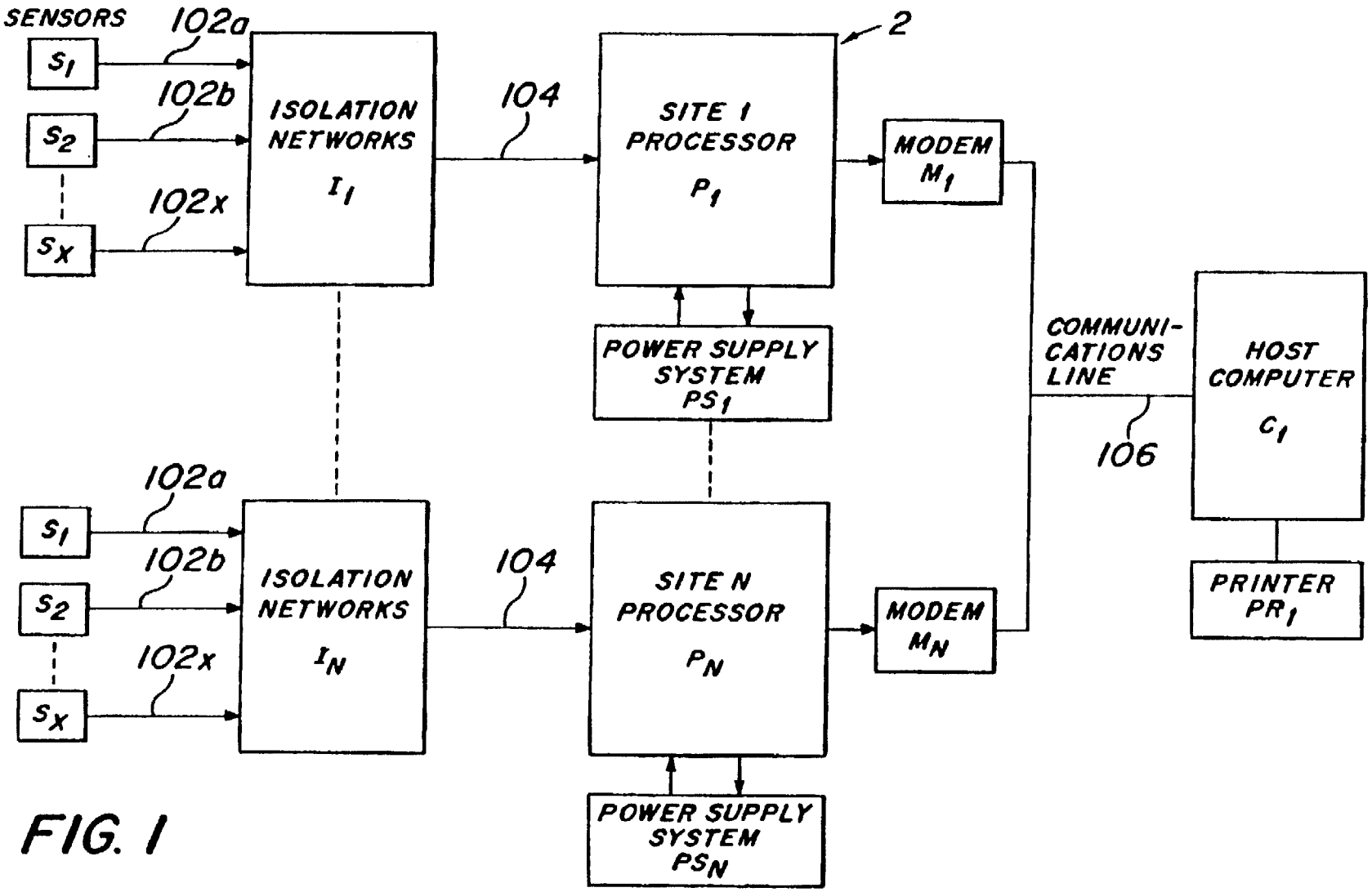
FIG. 1 is an overall block diagram of the measuring and monitoring system.

Referring now in greater detail to the various figures of the drawing wherein like references and characters refer to like parts, the measuring and monitoring system 2 of the instant invention is shown is FIG. 1. At each individual remote site, a series of sensors S1 through SX are installed at power consumption devices at the remote site. For lighting fixtures or electric devices, photoelectric sensors, which require no external or internal power, are used to indicate whether the light is on or off. For a series of lights which are powered by a single power switch, a single sensor can be used to detect the on/off condition of the bank of lights.

For other types of electrically operated devices, such as air-conditioners, blowers, motors, heaters and the like, current transformers, which are clipped around the input power leads of the devices, determine when the device is drawing power.

As can be seen in FIG. 1, the system 2 is capable of handling a plurality of sites, through N. The sensors S1 through SX are connected, via lines 102a through 102x, respectively, to isolation networks I, which isolate the sensors from the remainder of the electronic equipment at the site. The output of the isolation networks are sampled by the processor at each site. A predetermined time interval for sampling, between 1 and 99 minutes, is transmitted from the host computer to the site processor.

The power supply system PS1 provides regulated 5 volts DC (P5) to the equipment at the site. The output of the site processor is sent to a modem M1 which outputs the information on a communications line 106 to the host computer C1 at a remote location. The host computer processes and formats the incoming monitoring data and prints out reports relating to power consumption for each sensor or group of sensors over a specified period of time. The host computer is capable of handling the outputs of a large number of sites from 1 to N, as can be seen in FIG. 1. A printer PR1 is used to produce reports which will be described in detail later.

Figure 2:
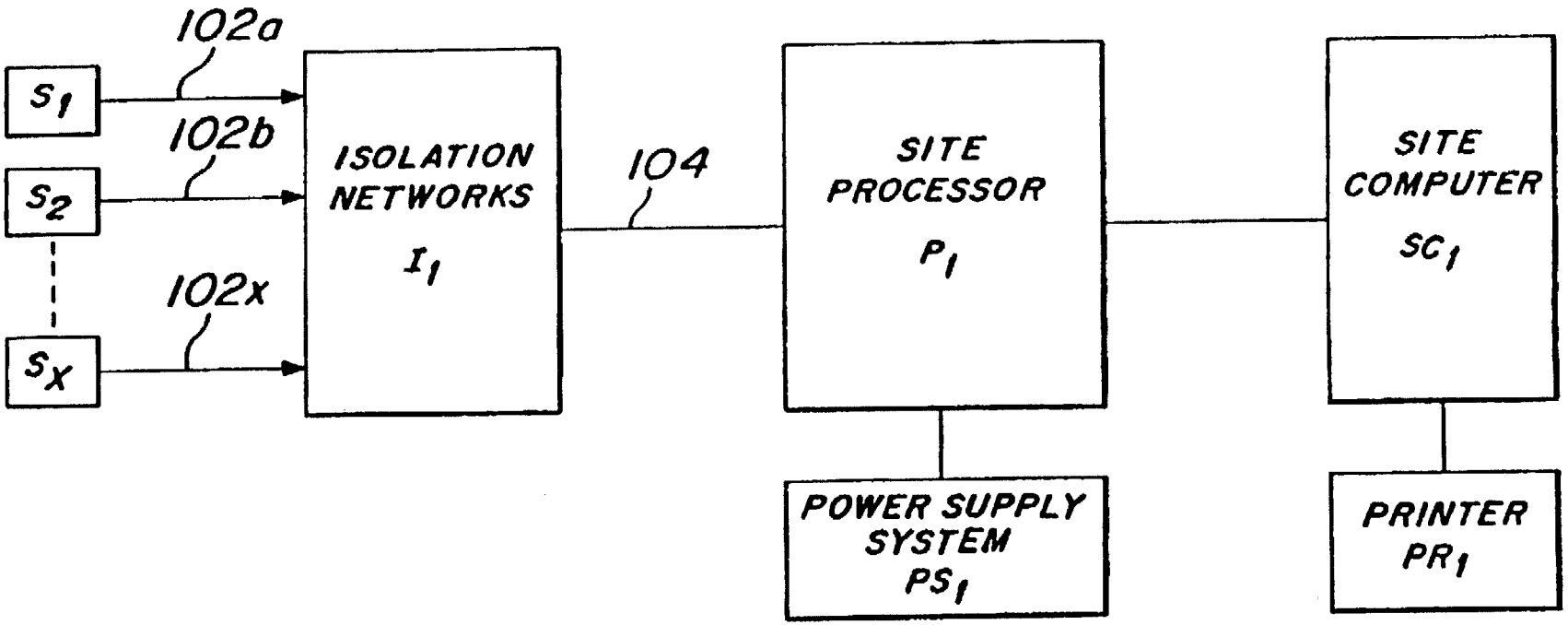
FIG. 2 is a block diagram of a stand-alone system for single site operation.

FIG. 2 is a block diagram of an alternative stand-alone system at a site. As in the multi-site systems, the outputs of sensors S1–SX are connected to isolation networks I1 and from there to the site processor via lines 104. The site also has a processor P1 with a power supply system PS1. However in the case with the stand-alone system, a PC computer SC1 is located at the site to process and format the monitoring information from the site processor P1. A printer PR1 is used to generate reports at the site. The power supply system, besides providing regulated 5 volt DC power to the equipment on site, has fail-safe circuitry which maintains the sampled monitoring data and a real time clock calendar in the event of a power failure, for up to 24 hours.

Figure 3:
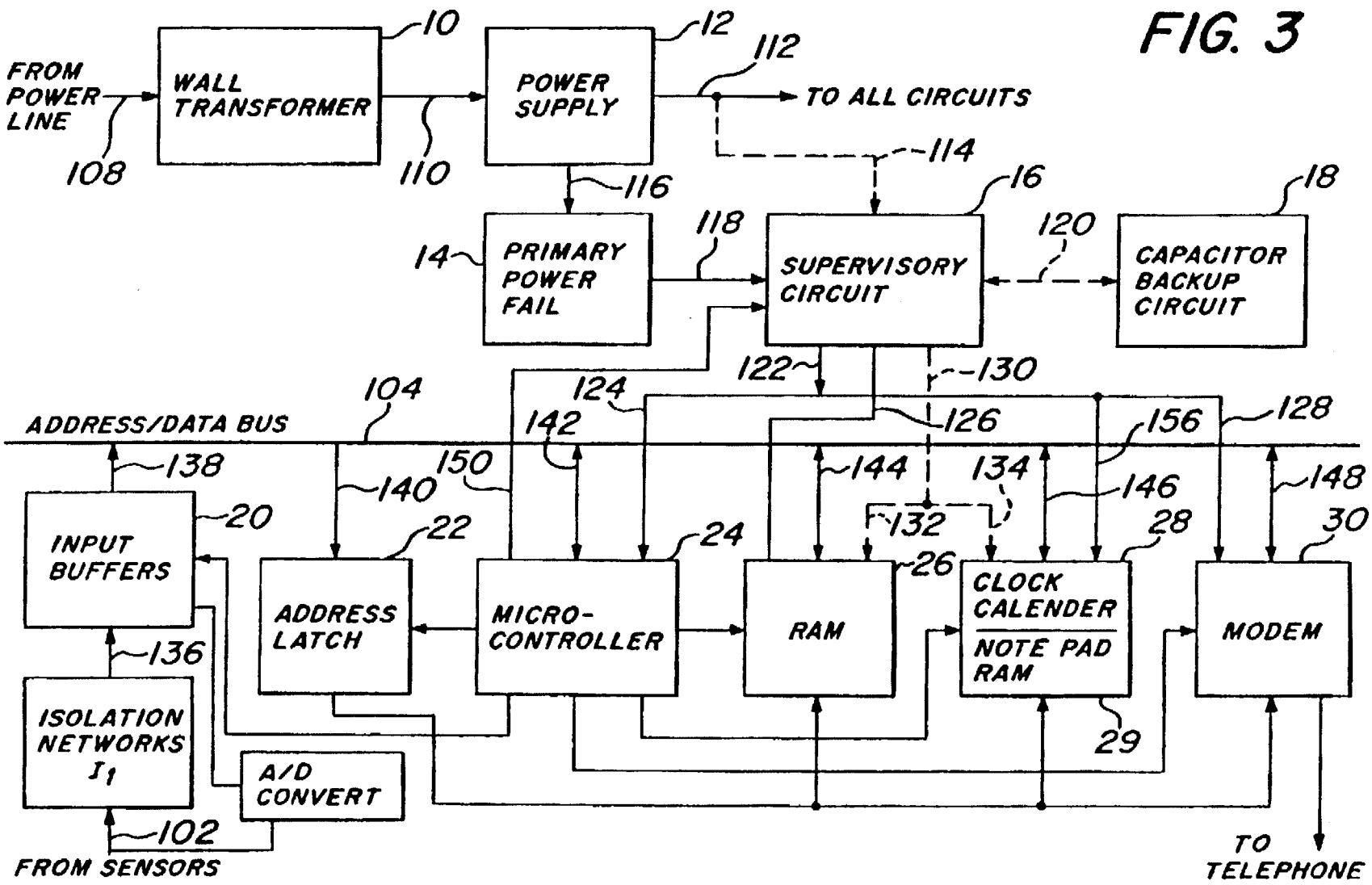
FIG. 3 is a detailed block diagram of the equipment at each remote site.

FIG. 3 is a detailed block diagram of the site equipment. The power and power supervisory system will now be explained. AC power at the site from the power line is connected to a wall transformer 10 via line 108. The output of the wall transformer on line 110 provides 10 volts AC and earthground to the power supply unit 12. The output of the power supply 12, on line 112, is filtered and regulated 5 volt DC power which is supplied to all the circuits. It comprises ferrite bead inductances, a diode bridge, capacitors and a voltage regulator. The Power On condition is indicated by a light emitting diode (not shown) on the equipment.

Power supply unit 12 is connected to a primary power fail circuit 14 by line 116. If AC power is interrupted, a supervisory circuit 16 receives a power fail signal on line 118 from the primary power fail circuit 14. The primary power fail circuit 14 comprises a pair of diodes and a capacitor-resistance network which produces a DC voltage. When the power is interrupted, the voltage begins to decrease which indicates to the supervisory circuit 16 that a failure is occurring.

The supervisory circuit 16, upon receipt of the signal from the power fail circuit, begins an orderly shutdown of the equipment before the DC power becomes too low by producing a reset signal on lines 122 and 124 to the micro-controller 24, on lines 122 and 128 to the modem 30 and to the clock calendar 28 on lines 122 and 156.

The supervisory circuit 16 also receives a signal from a micro-controller 24 on line 150 which indicates that the micro-controller is properly executing the program. If the signal is not supplied within a required time, the supervisory circuit sends a reset signal to the micro-controller 24 and to the modem 30 on lines 126 and 128, respectively. The supervisory circuit 16 also sends a memory enable signal to the random access memory 26 on line 126 to ensure that the memory is protected during a power failure event.

The power fail circuit path is shown in dashed lines in FIG. 3. The power supply output P5 (5 volts D.C.) is sent to the supervisory circuit via line 114. Connected to the supervisory circuit is a capacitor back-up circuit 18 via line 120. The capacitor back-up circuit 18 comprises capacitors which are charged through a resistor to provide input power to the supervisory circuit 16. When a primary power fail indication occurs on line 118, the supervisory circuit accepts the output of the capacitor back-up circuit and routes the back-up DC voltage to the random access memory, RAM 26 and the clock calendar 28 to maintain their operation during a power outage, on lines 130, 132 and 134, respectively.

In summary, the power supply system, PS1, detects the start of a power failure and alerts the RAM 26 and the clock/calendar 28 to accept back-up power and sends reset signals to the micro-controller 24 and the modem 30 to provide an orderly shutdown before the voltage P5 becomes too low.

When the voltage output of the power supply 12 begins to drop at the onset of a power failure, the micro-controller 24 writes the time and date of the failure into the RAM 26. During the outage, only the clock/calendar 28 and the RAM 26 will be powered. The system will maintain the clock operation and information in the RAM 26 for 24 hours. When the power comes back up, the micro-controller writes the time again into the RAM 26.

The site processor P1 and associated equipment will now be described. As can be seen in FIG. 3, the on/off indication voltage from each of the sensors is transmitted on lines 102 to the isolation networks I1. The output of the isolation networks on lines 136 are sent to input buffers 20 and from there on lines 138 to the address/data bus 104. The other units of the processor P1, an address latch 22, the micro-controller 24, the random access memory RAM 26, the clock calendar 28, and the modem M1 communicate with each other on lines 140, 142, 144, 146, and 148 respectively, via the address/data bus 104.

The micro-controller 24 is the main controlling element for the processor P1 and controls all the programmable functions of the other circuits. It executes the program instructions utilizing a program read-only memory (PROM) with the control instructions for operating the micro-processor. The micro-controller 24 comprise an internal random access memory (RAM) which is available for temporary storage of data, a timer and counters for general timing and counting use, an oscillator to provide a clock frequency using a crystal capacitor, input/output and controls which provide paths for communication and control external to the micro-controller 24, and a direct user input control in the form of a pushbutton.

The address latch 22 provides the address bits for the random access memory RAM 26.

The RAM 26 stores the monitored sensor data which will be ultimately transferred to the host computer C1. The clock/calendar 28 provides time of day, power fail time, alarm functions and date information. The circuit uses an internal crystal oscillator with capacitors which may be trimmed to precision accuracy. It contains a small amount of internal random access memory 29 (notepad RAM) which stores status and command information sent from the host computer.

The modem M1 provides for the exchange of information between the site processor, P1 and the host computer, C1. A 1200 band, full duplex modem is used with timing generated by a crystal and capacitors.

Figure 4:
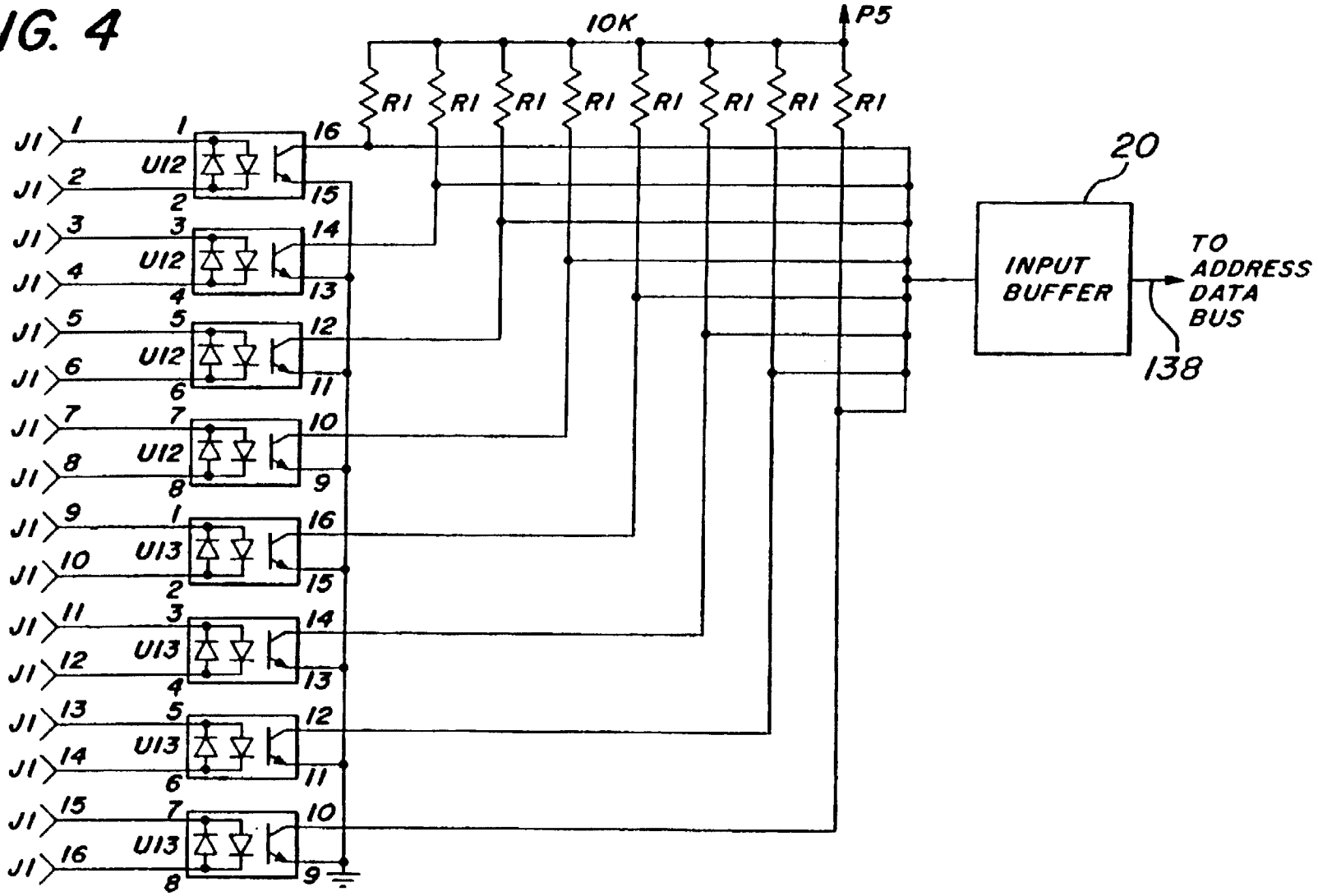
FIG. 4 is a schematic of a portion of the isolation networks which isolate the sensors from the remainder of the site equipment.

FIG. 4 shows a portion of the isolation networks I1. The inputs from 8 sensors are shown. Four such circuits are used, so that the site processor P1 is capable of handling a remote monitoring system with up to thirty-two sensor inputs. The isolation couplers can be standard available optically coupled isolators such as unit PS2506-4 or its equivalent. Two such units comprise an individual network of eight opto-isolators. The isolators are provided power from P5 through resistors R1. The outputs of the isolators are then sent to the input buffer 20 on lines 136, and from the input buffer 20 on lines 138 to the address/data bus 104.

The other equipment at the site, the site processor P1, the power supply system PS1 and the modem M1 can also be produced using standard off-the-shelf components and chips. For example, the micro-controller 24 may comprise an 8748H chip or equivalent manufactured by Intel. It has a 1K×8 embedded read-only memory (EPROM) with a 64×8 random access memory (RAM). The random access memory can comprise an integrated chip, MCM60L25A, produced by Motorola, or its equivalent produced by Itachi, an HM62256LP chip which has a 32,746×8-bit random access memory. The modem 30 can comprise a 73 K222UIP chip produced by Silicom Systems or its equivalent.

In an alternate embodiment, analog sensors are installed to provide actual power consumption of each of the devices. Analog to digital (A to D) converters are used to digitize the output of each sensor for storage and processing.

Referring to FIG. 1–3, in the alternate embodiment, the outputs of the analog sensors appear on lines 102, with the isolation network I1 replaced by A-D converters (not shown).

The protocol for the communication data transmitted between the site equipment and the host computer C1 will now be described:

The system protocol, hereinafter referred to as the "protocol", is a communications protocol that transmits data over an asynchronous interface (COM port) on an IBM compatible PC. The system protocol is designed to communicate information between the host computer C1 and an IBM compatible 286 or 386 site processor P1.

Basic Communications Overview

To understand the protocol, a brief description of the communications that take place between the site processor and the host computer must be reviewed. The following sequence of events takes place between the site processor and the host computer running.

1. The site processor calls and the unit establishes communication with the host computer.
2. The site processor uploads status information to the host. The host uses this information to determine which actions to take.
3. The host verifies the status information, requests the actual monitoring data, and receives the monitoring data from the site processor.
4. The host then creates and sends a new updated file of status and command information to the site processor telling it when to call in next.
5. The host verifies the information it sent to the site processor.
6. The site processor is put back in computer mode and the units disconnect.
7. The host software translates all data received into the databases.
8. The host then waits for the next site equipment to call in.

Communications Protocol

All the transfers described in the previous section take place using a special protocol. The use of a protocol is necessary so that either end can understand the information that is being received. The protocol operates over an asynchronous interface that operates at 1200 baud with 8 data bits, no parity, and 1 stop bit.

The three basic formats used by the protocol are as follows:

Command Mode
Block Mode
Control

One of these modes must be used for any communications between the site processor and the host computer to take place. All information is sent in either Hexidecimal or Binary Coded Decimal (BCD) notation.

The "Command Mode" format is used by the site processor and the host computer to tell the receiving end to perform a certain operation. There are five commands used in this mode:

| | |
|---|---|
| Test Mode (T) | tests the site equipment |
| Transmit Status (S) | request the site equipment status information (described later) |
| Transmit Data (D) | request the site processor to send sensor data |
| Setup (U) | send update or setup information to the site processor |
| Monitor Mode (M) | puts the site processor back into monitoring mode. |

The "Command Mode" format is comprised of a header (ESC or 1B-hex), line number and the line number compliment (used for error detection), a command (T,S,D,U, or M), six data bytes (hex), and a checksum. The checksum character is used to detect communication errors.

Transmit Status (S) information sent by the site processor tells the host computer several things about the site equipment:

| | |
|---|---|
| Unique System ID | Site processor identification number that tells the host which unit is transmitting. This number is unique for each unit. |
| Current time | Current time of the site processor's internal clock. |
| Alarm [time] | Time the site processor was programmed to call the host computer. |
| Status/control | Special information about the site processor including: Error codes (if any) Type of phone system (Tone or Pulse) Leap year information |
| Primary phone number (P1) | Main phone number that the site processor unit dials to transfer data. |
| Service phone number (P2) | Service phone number that the site processor dials in case of emergencies or after all retries on P1 were unsuccessful. |
| Checksum on phone numbers. | Data transfer checksum code. This number is the summation (in hex) of all the digits in the two telephone numbers with the carry thrown away. It is checked by the site processor and the host computer to determine if an error occurred in a transmission. |
| Sample rate for the site processor | Polling interval that the site processor uses to "grab". information from its 32 sensors. |
| Next address | This is the next memory address that the site processor with write to (max = 8000-hex). Its is mainly used to tell the host computer how many records of sensor data to read in. |
| Flag address | This memory address tells the site processor to call the host when memory gets to this address. It is used to prevent the site processor from running out of memory. |
| Start time | The time that the site processor was updated last and put into monitoring mode by the host computer. |

This information results in 11 "Command Mode" format lines of status information that the site processor sends to the host computer.

The "Command Mode" format is also the format used by the host computer to send the site processor "Update" (U) or status and command information. Status and command information is very similar to the Status information described previously, with the exception of one line; the omission of the line that has the site processor ID information. Consequently, only 10 "Command Mode" format lines are sent to the site processor from the host with the update command.

The host changes the site processor's current time with its own clock time. This is done so that the PC's and site processor's clocks are in sync. The host also resets the next address for recording sensor data in the RAM 26 to 0000 (hex). This is because all the data has already been transferred an the site processor should start storing new monitoring data at the beginning of its memory. The host re-programs the site processor with a new alarm (call in) and start times. This is generated by the host computer program and is based on the parameters set by the user.

All update information can be changed at any time by the host computer.

The "Block Mode" format is strictly used to send "Transmit Data" (D) information from the site processor to the host PC. After the site processor has been sent the "Transmit Data" command, sensor point power usage data is sent in a special format, along with any power outage information. The special data format includes special control codes that identify which bytes of data are actual power usage data, and which are recorded power usage down and up times.

In the block mode, each block of data sent is comprised of a header (SOH or 01-hex), the block number and its compliment, 128 bytes of sensor and any power outage data, followed by a Checksum. Here again, the checksum is used to detect any errors that ma have occurred during the transmission. When all blocks are sent, the site processor sends an "EOT" (or 04-hex) character. The site processor pads the 128 bytes with 0's if needed.

The command and block mode formats are usually followed by a special code sent in the "Control Mode" format. The site processor is then placed into "Monitoring Mode" using the M command.

The "Control Mode" is a single ASCII code sent in hexidecimal format. Control mode codes are as follows:

| CODE ABBREV | HEX CODE | MEANING |
|---|---|---|
| ACK | 06 | Acknowledge a Command or Block Mode transfer (successful transfer) |
| NAK | 15 | Not acknowledge a Block Mode transfer (unsuccessful transfer) |
| EOT | 04 | Identify the end of a block of sensor data. |
| CAN | 18 | Cancel an operation |

The site processor has certain control parameters that determine how communications should operate.

| Call out parameters | |
|---|---|
| Dial Tone Wait (10 seconds) | Time that the site processor will wait for a Dial Tone before hanging up. |
| Blind Dial Wait (2 seconds) | This is the number of seconds that the site processor waits to dial after the site processor manual transmit button has been pressed. |
| Wait for Answer (60 seconds) | Time that the site processor will wait for the host computer to answer the call. |
| Retries (10) | The number of times that the site processor will try to call the host. |
| Retry Interval | The interval between each (5 minuter) retry. |
| Retry Wait (next night same time) | The next time that the site processor will try and call after the first 10 retries fail. |

-continued

| Call out parameters | |
|---|---|
| Response Timeout (15 seconds) | This is the maximum time that the site processor waits to get a response from the host before sending a NAK to the host |
| Carrier Dropout | This is the maximum time (2 seconds) allowed for small carrier dropouts before the site processor will hang up. |
| Allowed connection Time (10 min.) | This is the total amount of time that the site processor will stay connnected to the host with no activity. Then it hangs up. |

As described previously, the preferred embodiment allows for the monitoring of up to thirty-two power consuming devices. For each sampling, the outputs of the thirty-two sensors are stored in four 8-bit bytes of the RAM 26 memory. If less than thirty-two sensors are used, the unused bits are padded with "zeros". The output of each sensor S1 to SX is directed by the micro-controller 24 sequentially into the RAM 26. The RAM 26 comprises approximately 32,768 8-bit bytes of memory. Each four bytes of sampled data is referred to as one sampling or one data record. The output of sensors 1 through 8 is stored at the first available address location in the RAM, the output of sensors 9–16 is stored in the next available address location in the RAM with the output of sensors 17–24 and 25–32 stored in turn in the next two available address locations. Thus, the results of a sampling are stored as ones or zeroes in 4 bytes of memory in sequence.

At each sampling interval the outputs of the sensors are again sampled and stored in the next four sequential storage addresses. Eight data records are stored in sequence utilizing 32 bytes of storage. The 33rd byte is used to indicate whether a power outage has occurred in any of the previous eight data records.

Should a power outage occur, the voltage on line 112 begins to drop. At a predetermined point, for example, if the 5 volt D.C. output of the power supply 12 has dropped to 4.2 volts, the supervisory circuit 16 alerts the micro-controller 24 which places the time and date into the next available storage location in the RAM 26. The clock calendar 28, the notepad RAM 29 and the RAM 26 are maintained in operation during the power outage with power provided by the capacitor backup circuit 18. When the power comes back up, the micro-controller will insert into the next available address in RAM 26 the time and date at which power was restored.

After 32 bytes have been filled in the RAM 26, the 33rd byte, which is indicative of whether a power outage has occurred, is written by the processor into the next address of RAM. That byte will identify whether a power outage has occurred, and if so, it will identify the address in which the time and date of the occurrence of the power outage is stored. Both the micro-controller at the remote site and the host computer know that the byte following the byte which identifies the time and place of the occurrence of the power outage will contain the information as to the time and date at which power was restored.

As described in the protocol, after the site processor has uploaded the status information to the host, the host requests the monitored data from the site processor. At this time, the data stored in RAM 26, which is stripped-down, on/off data from the sensors and power outage information is sequentially transmitted to the host computer in blocks of 128 bytes. The host computer keeps track of the time and the identification of each sensor because it knows the time of the initial sampling, the sampling rate, and the fact that the outputs of the sensors are placed into the RAM 26 sequentially.

Of course, a power outage breaks the sequence. Therefore, the host computer, upon receiving the information in the 33rd byte, after eight records, knows the time that the outage occurred, and also can maintain the sequence to identify each of the sensor outputs after a break in the sequence due to the power outage. Thus, the protocol provides a compressed and very efficient means for storing and transmitting stripped-down data and it eliminates the necessity for identifying sensors and time and date with the sampled data each time the sampled data is stored.

The site processors P1–N are all under the command and control of the host computer C1. At the conclusion of the transmittal of the monitored data, the host computer C1 transmits to the site processor the time and date to initiate new samplings, the sampling interval, the time and date for the next reporting of monitored data by the site processor, the time and date of its own clock/calendar so that the site processors P1–PN can update and synchronize their clock/calendars 28 with the host computer's clock/calendar and a flag address to warn the site processor that it is nearing the end of its RAM 26 memory capacity. The site processors are also directed to start at the first RAM storage address. Thus, the new information is written over existing information in the RAM.

The flag address is a address which tells the site processor to call the host when the memory gets to the address to prevent the site processor from running out of memory. If the site processor detects the fact that the next address is the flag address it will call the host computer and send the host computer the contents of the RAM 26 memory so that the site processor can begin placing monitored data at the first address in the RAM again before it runs out of storage locations.

The host computer processes and formats the power usage data that it receives from the remote site. It manages the data transfer between the remote sites and the central location and schedules the operation and communications flow between the remote sites and the central location. It includes various data bases including data bases for the actual power usage of each of the remote sites. It generates reports and graphs based on monitored and calculated data. It provides various utility functions such as system configurations, assigning of passwords, archiving of data and functions which allow the user to modify the data bases in different ways.

The host computer has various data bases as follows:

(1) a utility/rate data base which contains information about the utilities rate structure which is used for reports and billing;

(2) a site data base which contains information about the remote site location as well as the scheduling information for the remote sites;

(3) a sensor data base which identifies the various sensor points at each remote site and contains information about the sensor points;

(4) a sensor data base which contains power usage data for each sensor point at each remote site;

(5) a call-in history data base which maintains a log of each data transfer that has occurred; and (6) auxiliary data bases which define terms such as codes that utility companies use for their rate structure and which contain other special information relating to the utilities.

The host computer communicates and transfers power usage data between the remote sites and the central location via a modem connected to COM ports of an IBM compatible PC. The host monitors the PC's port for incoming calls from the remote sites. The host computer is capable of managing multiple remote sites and automatically returns to the monitoring mode after a data transfer has taken place.

After the data has been placed into the various data bases, the host computer prints messages on a printer as well as to a disk-based text file so that data transfer information can be viewed at a later time.

The information received by the host computer, in addition to the information stored in the host computer relating to the sensors at the remote sites, enables the host computer to provide print-outs on site usage over periods of time. These sensor points may be placed into groupings such as lighting for offices, computer room power, warehouse power consumption and so forth and summaries of the loads and hours of use and the kilowatt hours consumed over various periods of time and during peak or off-peak periods can be made available. In addition, if the user installs power-saving devices or equipment, the amount of savings can be calculated. Thus, a series of remote sites can be monitored on a continuous basis to determine where, when and how the power is being used, and the rates and costs of the uses of the power.

A system for monitoring and measuring power usage of various devices installed at facilities has been described. The system uses sensors installed at the power usage devices which sense whether the device is drawing power. The output of the sensors are connected to a processor at each facility which is under the control of a host computer at a central location. The host computer directs the processor to begin polling the sensor at specified time intervals and to report and transmit the data back to the host processor at a specific time and date.

The system uses a protocol which enables storage of stripped down usage data only without the need for recording other information at each sampling or polling. This not only results in substantial savings and memory storage capacity but also reduces communication time, since raw polled data and power outage time periods only are transmitted and received by the host computer. The host computer also provides the initial storage location of the data in the processor so that, with the transmission of data and the power outage information, it can keep track of the correspondence between the data and each of the power sensors, and the time and date of each sampling or polling.

In an alternate embodiment, instead of using one bit of data to indicate the on or off status of power consuming devices, a sensor which generates a current or voltage proportional to the amount of power being used by each device is installed at the device. A to D converters are then employed to digitize the analog information so that it may be stored in the RAM of the processor. In this case, one byte of storage (8-bits of data) is used to store the output of each analog sensor. The byte indicates the amount of power being consumed by the device.

Without further elaboration, the foregoing will so fully illustrate my invention that others may, by applying current or future knowledge, readily adapt the same for use under the various conditions of service.

What is claimed as the invention is:

1. A system for [sampling, formatting, storing, processing and communicating to] *determining power usage data at* a central location [data representing the power usage of] *from* a plurality of power consuming devices *that are located* at a remote site, *said system* comprising:

(a) [a host computer located at said central location;

(b) a plurality of sensors each with an output representing] *a plurality of sensors coupled to a respective plurality of power consuming devices which are sampled repetitively by said sensors, each respective sensor detecting* the on-off condition of a respective one of said plurality of power consuming devices[, each of said sensors being located at a respective one of said power consuming devices] *at pre-determined time intervals for pre-determined time periods thereby defining on-off data*;

(*b*) *a host computer located at said central location, said host computer comprising storage means for storing operating data about each of the power consuming devices and sensor data about each of said sensors and further comprising means for processing said on-off data to generate said power usage data;*

(c) a processor, coupled to said plurality of sensors, at said remote site comprising:

(1) means for storing said *on-off* data[, said data comprising said on-off condition information for each of said power consumer devices, sampled repetitively, at a pre-determined time interval for a predetermined time period];

(2) a real time clock/calendar *for providing time and date information to said processor; and*

(3) a micro-controller;

(d) means[, coupled to said processor,] for communicating said *on-off* data from said [remote site directly] *processor* to said [central location] *host computer,* said means for communicating [said data] comprising ordinary public telephone lines and being independent of any power transmission lines or means; [and]

(*e*) said host computer *further* comprising means for controlling the operation and timing of said processor [comprising means for], *said controlling means* communicating status and command information from said host computer [directly] to said [remote site,] *processor via* said means for communicating;

(*f*) said [status and central information] *processor further* comprising [ordinary public telephone lines and being independent of any power transmission lines or means, and means in said processor for storing] *means for storing and processing* said status and command information.

2. The system of claim 1, wherein said status and command information comprises a specified time and date for said processor to initiate sampling, a specified time interval between samplings and a specified time and date at which the remote site is to communicate with the central location to transmit said data to said central location.

3. The system of claim 2, wherein said status and command information from said central location further comprises time and date information provided by a master clock/calendar at said central location and said processor further comprises a means for updating and synchronizing said clock/calendar with said master clock/calendar.

4. The system of claim 3, wherein said means for storing said data and said means for storing said status and command data comprise a random access memory (RAM).

5. The system of claim 4, wherein said RAM comprises a first RAM for storing said data and a second RAM for storing said status and command data.

6. The system of claim 4, wherein said processor further comprises means to initiate sampling of said data and for directing the storage of the outputs of said sensors into said RAM at said specified time and date for initiating sampling.

7. The system of claim 6, wherein said status and command information further comprises a specified RAM storage address location for the start of said storage of said data and said processor further comprises means for writing said data into said specified RAM storage address location.

8. The system of claim 7, wherein said processor further comprises means for repetitively sampling and storing of said data at the specified time intervals of said status and command information.

9. The system of claim 8, wherein said processor further comprises means for writing said repetitive samplings into successive sequential storage address locations in said RAM.

10. The system of claim 9, wherein said system further comprises a means for detecting the occurrence of a power outage and for providing back-up power to said RAM and to said clock/calendar during said outage.

11. The system of claim 10, wherein said means to provide back-up power comprises a capacitor-resistor network.

12. The system of claim 11, wherein said processor further comprises means for writing into said RAM the time and date of the occurrence of said power outage and the time and date of the restoration of power after a power outage.

13. The system of claim 12, wherein said processor further comprises means to write said time and date of the occurrence of power outage into the next sequential address location in said RAM and to write said time and date of the restoration of power into the address location sequentially following said next sequential address location.

14. The system of claim 13, wherein after a predetermined number of samplings of data have been stored in said RAM, said processor further comprises means to write into the next available address location of said RAM information which indicates whether a power outage has taken place during said predetermined number of samplings and if there has been a power outage, the address location of said time and date of the occurrence of said power outage.

15. The system of claim 14, wherein said means to communicate said data from said remote site to said control location and for communicating said status and command data from said control location to said remote site comprises a modem at said remote site, and a modem at said central location.

16. The system of claim 15, wherein said RAM comprises means for storing said data in eight bit bytes and said system comprises up to thirty-two of said sensors and the means to store each sampling of the outputs of said sensors in four sequentially addressed byte locations.

17. The system of claim 16, wherein said processor further comprises means to write eight samplings (thirty-two bytes) of data at sequential address locations in said RAM and means to write to the next sequential address in said RAM said information indicating whether a power outage has occurred and the address location and the time and date of the occurrence of said power outage.

18. The system of claim 17, wherein said central location further comprises means to request the transmission of said sampled data and power outage information stored in said RAM and said remote site comprises means to transmit said sampled data and said power outage information to said central location.

19. The system of claim 18, wherein said remote site further comprises means to transmit said data and said power outage information to said central location in blocks of one hundred twenty eight, eight bit bytes.

20. The system of claim 19, wherein said remote site further comprises means to transmit to said central location status information for enabling said host computer to interpret said blocks of data and power outage information.

21. The system of claim 20, wherein said status information further comprises the site processor identification number, the current time of its clock/calendar, said specified time and date for the processor to communicate with the host computer to transmit said data, the interval between samplings of the outputs of said sensors, the next available address in said RAM, and said time and date at which the site processor was put into its monitoring mode by the host computer.

22. A system for [sampling, formatting, storing and communicating to] *determining power usage data at* a central location[, data representing the power usage of] *from* a plurality of power consuming devices *that are located* at a plurality of remote sites, *said system* comprising:

(a) [a host computer located at said central location;

(b) a plurality of sensors at each of said plurality of remote sites, each of said sensors with an output which represents] *a plurality of sensors coupled to a respective plurality of power consuming devices which are sampled repetitively by said sensors, each respective sensor detecting* the on-off condition of a respective one of said plurality of power consuming devices[, each of said sensors being located at a respective one of said power consuming devices] *at pre-determined time intervals for pre-determined time periods thereby defining on-off data*;

(*b*) *a host computer located at said central location, said host computer comprising storage means for storing operating data about each of the power consuming devices and sensor data about each of said sensors and further comprising means for processing said on-off data to generate said power usage data;*

(c) a processor, coupled to said plurality of sensors, at each of said plurality of remote sites, *each processor* comprising:

(1) means for storing said *on-off* data[, said data comprising said on-off condition information for each of said power consumer devices, sampled repetitively, at a pre-determined time interval for a predetermined time period];

(2) a real time clock/calendar *for providing time and date information to said processor*;

(3) a micro-controller; and (4) means for accepting from said host computer an identification indicia which is unique for each remote site; [and (d) means, coupled to each of said processors, for communicating said data from each of said plurality of remote sites to said central location said means for communicating said data comprising ordinary public telephone lines and being independent of any power transmission lines or means; and]

(*d*) *means for communicating said on-off data from each of said processors to said host computer, said means for communicating comprising ordinary public telephone lines and being independent of any power transmission lines or means;*

(*e*) said host computer *further* comprising means for controlling the operation and timing of said processor at each of said plurality of remote sites, [comprising means for] *said controlling means* communicating status and command information from said host computer to each of said plurality of [remote sites,] *processors via* said means for communicating;

(*f*) *each of* said [status and central information] *processors further* comprising [ordinary public telephone lines and being independent of any power transmission lines or means, and means for storing in said processor] *means for storing and processing* said status and command information; and (*g*) each of said processors further comprises means for accepting only said information which includes its unique identification indicia.

23. The system of claim 22, wherein said status and command information comprises a specified time and date for said processor to initiate sampling, a specified time interval between samplings and a specified time and date at which each of said plurality of remote sites is to communicate with said central location to transmit said data to said central location.

24. The system of claim 23, wherein said status and command information from said central location further comprises time and date information provided by a master clock/calendar at said central location and said processor further comprises a means for updating and synchronizing said clock/calendar with said master clock/calendar at said central location.

25. The system of claim 24, wherein said means for storing said data and said means for storing said status and command data comprise a random access memory (RAM).

26. The system of claim 25, wherein said RAM comprises a first RAM for storing said data and a second RAM for storing said status and command data.

27. The system of claim 25, wherein said processor comprises means to initiate sampling of said data and for directing the storage of the outputs of said sensors into said RAM at said specified time and date for initiating sampling.

28. The system of claim 27, wherein said status and command information further comprises a specified RAM storage address location for the start of said storage of said data and said processor comprises means for writing said data into said specified RAM storage address location.

29. The system of claim 28, wherein said processor further comprises means for repetitively sampling and storing of said data at the specified time intervals of said status and command information.

30. The system of claim 29, wherein said processor further comprises means for writing said repetitive samplings into successive sequential storage address locations in said RAM.

31. The system of claim 30, wherein said system further comprises a means for detecting the occurrence of a power outage at each of said plurality of remote sites and for providing back-up power to said RAM and to said clock/calendar during said outage.

32. The system of claim 31, wherein said means to provide back-up power comprises a capacitor-resistor network.

33. The system of claim 32, wherein said processor further comprises means for writing into said RAM the time and date of the occurrence of said power outage and the time and date of the restoration of power after a power outage.

34. The system of claim 33, wherein said processor further comprises means to write said time and date of the occurrence of power outage into the next sequential address location in said RAM and to write said time and date of the restoration of power into the address location sequentially following said next sequential address location.

35. The system of claim 34, wherein after a predetermined number of samplings of data have been stored in said RAM, said processor further comprises means to write into the next available address location of said RAM information which indicates whether power outage has taken place during said predetermined number of samplings and if there has been a power outage, the address location of said time and date of the occurrence of said power address.

36. The system of claim 35, wherein said means to communicate said data from each of said plurality of remote sites to said central location and for communicating said status and command data from said control location to each of said remote site comprises a modem at each of said plurality of remote sites, and a modem at said central location.

37. The system of claim 36, wherein said RAM comprises means for storing said data in eight bit bytes and said system comprises up to thirty-two of said sensors and means to store each sampling of the outputs of said sensors in four sequentially addressed byte locations.

38. The system of claim 37, wherein said processor further comprises means to write eight samplings (thirty-two bytes) of data at sequential address locations in said RAM and means to write to the next sequential address in said RAM said information indicating whether a power outage has occurred and the address location and the time and date of the occurrence of said power outage.

39. The system of claim 38, wherein said central location comprises means to request the transmission of said sampled data and power outage information stored in said RAM and each of said plurality of remote sites comprises means to transmit said sampled data and said power outage information to said central location.

40. The system of claim 39, wherein each of said plurality of remote sites comprises means to transmit said data and said power outage information to said central location in blocks of one hundred twenty eight, eight bit bytes.

41. The system of claim 40, wherein each of said plurality of remote sites further comprises means to transmit to said central location status information for enabling said host computer to interpret said blocks of data and power outage information.

42. The system of claim 41, wherein said status information further comprises the site processor identification number, the current time of its clock/calendar, said specified time and date for the processor to communicate with the host computer to transmit said data, the interval between samplings of the outputs of said sensors, the next available address in said RAM, and said time and date at which the site processor was put into its monitoring mode by the host computer.

43. A system for [sampling, formatting, storing and communicating] *determining power usage* data [representing the power usage of] *from* a plurality of power consuming devices *that are located* at a facility, *said system* comprising:

(a) [a host computer located at said facility;

(b) a plurality of sensors each with an output which represents] *a plurality of sensors coupled to a respective plurality of power consuming devices which are sampled repetitively by said sensors, each respective sensor detecting* the on-off condition of a respective one of said plurality of power consuming devices[, each of said sensors being located at a respective one of said power consuming devices] *at pre-determined time intervals for pre-determined time periods thereby defining on-off data*;

(*b*) *a host computer located at said central location, said host computer comprising storage means for storing operating data about each of the power consuming devices and sensor data about each of said sensors and further comprising means for processing said on-off data to generate said power usage data;*

(c) a processor, located at said facility, and coupled to said plurality of sensors, comprising:

(1) means for storing said *on-off* data[, said data comprising said on-off condition information for each of said power consumer devices, sampled repetitively, at a pre-determined time interval for a predetermined time period];

(2) a real time clock/calendar *for providing time and date information to said processor*; and (3) a micro-controller; [and]

(*d*) *means for communicating said on-off data from said processor to said host computer, said means for communicating comprising ordinary public telephone lines and being independent of any power transmission lines or means;*

(*e*) said host computer *further* comprising means for controlling the operation and timing of said processor, *said controlling* means [for] communicating [said] status and command information from said host computer to said processor[,] *via* said means for communicating;

(*f*) said [status and command information] *processor further* comprising wiring which is independent of any power transmission lines or means, and means, in said processor, for storing *and processing* said status and command information.

44. The system of claim 43, wherein said status and command information comprises a specified time and date for said processor to initiate sampling, a specified time interval between samplings and a specified time and date at which said processor is to communicate with the central location to transmit said data to said central location.

45. The system of claim 44, wherein said status and command information from said host further comprises time and date information provided by a master clock/calendar in said host computer and said processor further comprises means for updating and synchronizing said clock/calendar with said master clock/calendar.

46. The system of claim 45, wherein said means for storing said data and said means for storing said status and command data comprise a random access memory (RAM).

47. The system of claim 46, wherein said RAM comprises a first RAM for storing said data and a second RAM for storing said status and command data.

48. The system of claim 46, wherein said processor comprises means to initiate sampling of said data and for directing the storage of the outputs of said sensors into said RAM at said specified time and date for initiating sampling.

49. The system of claim 48, wherein said status and command information further comprises a specified RAM storage address location for the start of said storage of said data and said processor comprises means for writing said data into said specified RAM storage address location.

50. The system of claim 49, wherein said processor further comprises means for repetitively sampling and storing of said data at the specified time intervals of said status and command information.

51. The system of claim 50, wherein said processor further comprises means for writing said repetitive samplings into successive sequential storage address locations in said RAM.

52. The system of claim 51, wherein said system further comprises a means for detecting the occurrence of a power outage and for providing back-up power to said RAM and to said clock/calendar during said outage.

53. The system of claim 52, wherein said means to provide back-up power comprises a capacitor-resistor network.

54. The system of claim 53, wherein said processor further comprises means for writing into said RAM the time and date of the occurrence of said power outage and the time and date of the restoration of power after a power outage.

55. The system of claim 54, wherein said processor further comprises means to write said time and date of the occurrence of power outage into the next sequential address location in said RAM and to write said time and date of the restoration of power into the address location sequentially following said next sequential address location.

56. The system of claim 55, wherein after a predetermined number of samplings of data have been stored in said RAM, said processor further comprises means to write into the next available address location of said RAM information which indicates whether a power outage has taken place during said predetermined number of samplings and if there has been a power outage, the address location of said time and date of the occurrence of said power address.

57. A method for automatically and repetitively sampling and storing data representing the on/off condition of a plurality of power consuming devices at a remote site with a processor using a random access memory (RAM) located at a remote site, and of communicating said data to a host computer, comprising the steps of:

(a) receiving, at said processor, status and command information from said host computer including data specifying the time and date at which said remote processor should initiate said sampling of said data, the time interval between samples of said data and the time and date at which said remote processor should report to, and communicate said sampled data to, said host computer;

(b) storing said status and command data in said RAM;

(c) sequentially sampling, at said time interval, the outputs of a plurality of power sensing devices, representing said on/off condition, each of said devices being installed at a respective one of said plurality of sensors, and communicating said outputs to said remote processor at said time and date for initiating said sampling;

(d) storing said outputs of said sensors in said RAM;

(e) sequentially storing each of said sequentially sampled outputs in said RAM; and (g) transmitting such said sampled output data directly from said processor to said host computer, using ordinary public telephone lines only, independent of any power transmission lines or means, at said specified reporting time and date.

58. The method of claim 57 wherein said remote site further comprises a real time clock/calendar, a power supply, and a modem, and said method includes the steps of:

(a) providing power to said processor, clock and modem from said power supply;

(b) charging a capacitor from said power supply;

(c) providing power, to maintain the operation of said clock and to maintain the data stored in said RAM during power outages, from said capacitor; and (d) resuming providing power to said remote processor RAM, clock and modem from said power supply upon termination of said power outage.

59. The method of claim 58 including the additional steps of:

(a) maintaining an accurate time and date in a clock/calendar at said host computer;

(b) transmitting from said host computer to said processor said accurate time and date; and (c) updating a clock/calendar at said remote site to correspond to said accurate time and date so that said remote site clock/calendar is synchronized with said host computer clock/calendar.

60. The method of claim 57 including the additional step of sequentially storing said sampled outputs in said RAM beginning at the storage address specified by said host computer in said status and command data.

61. The method of claim 60 including the additional steps of:

(a) storing in said RAM the time and date of each power outage and each power resumption; and (b) transmitting said time and date of each power outage and each power resumption from said processor to said host computer with said sampled outputs.

62. The method of claim 59 including the additional steps of:

(a) detecting the start of the occurrence of a power outage;

(b) storing in said RAM, at the next sequential storage address, said power outage time and date;

(c) detecting the resumption of power after such power outage;

(d) storing in said RAM, at the next sequential storage address, said time and date of said power resumption; and (e) storing in said RAM information as to whether a power outage at said remote site has occurred during a predetermined number of said samplings and the storage address location of said power outage time and date.

63. The method of claim 60 including the additional step of transmitting from said processor to said host computer, using standard public telephone lines only, independent of any power transmission lines or means, on command from host computer, status information representing said time and date of initial sampling, said time interval between samplings, said reporting time and date, the next available storage address location in said RAM, and a flag storage address which is the address of a predetermined percentage of the total available storage addresses.

64. The method of claim 63 including the additional steps of:

(a) comparing the next available address in said RAM with said flag storage address in said remote processor; and (b) transmitting said sample data from said processor to said host computer when said next available storage address equals said flag address.

65. The method of claim 64 including the additional steps of:

(a) storing in said RAM the time and date of each power outage and each power resumption; and (b) transmitting said time and date of each power outage and each power resumption from said processor to said host computer with said sampled output.

66. The method of claim 65 including the additional steps of:

(a) detecting the start of the occurrence of a power outage;

(b) storing in said RAM, in the next sequential storage address, said power outage time and date;

(c) detecting the resumption of power after such power outage;

(d) storing in said RAM, in the next sequential storage address, said time and date of said power outage; and (e) storing in said RAM information as to whether a power outage has occurred after a predetermined number of said samplings and the storage address location of said power outage time and date.

67. The method of claim 62 including the additional step of transmitting from said remote processor to said host computer, using standard, public telephone lines only, independent of any power transmission lines or means, on command from host computer, status information representing said time and date of initial sampling, said time interval between samplings, said reporting time and date, the next available storage address location in said RAM, and a flag storage address which represents a predetermined percentage of the total available storage addresses.

68. The method of claim 67 wherein said remote site further comprises a real time clock/calendar, a power supply, and a modem, and said method includes the additional steps of:

(a) providing power to said processor, clock and modem from said power supply;

(b) charging a capacitor from said power supply;

(c) providing power to maintain the operation of said clock/calendar and to maintain the data stored in said RAM during power outages from said capacitor; and (d) resuming providing power to said remote processor, RAM, clock/calendar and modem from said power supply upon termination of said power outage.

69. A system for [sampling, formatting, storing, processing and communicating to] *determining power usage data at* a central location [data representing the power usage of] *from* a plurality of power consuming devices [from] *that are located at* a remote site, said system comprising:

(a) [a host computer located at said central location] *a plurality of sensors coupled to a respective plurality of power consuming devices, each respective sensor measuring a respective parameter at pre-determined time intervals for pre-determined time periods and generating a corresponding electrical analog output signal of that parameter*;

(b) [a plurality of sensors each having an analogue output representing the power usage of a respective one of said plurality of power consuming devices, each of said sensors being located at a respective one of said power consuming devices] *an analog-to-digital converter for converting said corresponding electrical analog output signal into a respective digital representation, said analog-to-digital converter coupled to said plurality of sensors*;

(c) [a plurality of analogue to digital convertors, each connected to a respective one of said plurality of sensors] *a host computer located at said central location, said host computer comprising storage means for storing operating data about each of the power consuming devices and sensor data about each of said sensors and further comprising means for processing and formatting said digital representations in conjunction with said operating data to generate said power usage data*;

(d) a processor, coupled to said [plurality of analogue]*analog*-to-digital [converters] *converter*, a said remote site comprising:

(1) means for storing said [data, said data comprising said power usage sampled at a pre-determined time interval for a pre-determined time period] *respective digital representations*;

(2) a real time clock/calendar *for providing time and date information to said processor*; *and*

(3) a micro-controller;

[(4) means for converting said analogue output;]

(e) means for communicating said [data] *digital representations* from said [remote site directly to said central location coupled to said processor] *processor to said host computer when requested by said host computer*, said means for communicating [said data] comprising ordinary public telephone lines and being independent of any power transmission lines or means; [and]

(*f*) said host computer *further* comprising means for controlling the operation and timing of said processor [comprising means for communicating], *said controlling means communicating* status and command information from said host computer [directly] to said [remote site, said means for communicating] *processor via said means for communicating, and*

(*g*) *said processor further comprising means for storing and processing* said status and command information [comprising ordinary public telephone lines and being independent of any power transmission lines or means, and means in said processor for storing said status and command information].

70. The system of claim 69, wherein said status and command information comprises a specified time and date for said processor to initiate sampling, a specified time interval between samplings and a specified time and date at which the remote site is to communicate with the central location to transmit said data to said central location.

71. The system of claim 70, wherein said status and command information from said central location further comprises time and date information provided by a master clock/calendar at said central location and said processor further comprises a means for updating and synchronizing said clock/calendar with said master clock/calendar.

72. The system of claim 71, wherein said means for storing said data and said means for storing said status and command data comprise a random access memory (RAM).

73. The system of claim 72, wherein said RAM comprises a first RAM for storing said data and a second RAM for storing said status and command data.

74. The system of claim 73, wherein said processor further comprises means to initiate sampling of said data and for directing the storage of the outputs of said sensors into said RAM at said specified time and date for initiating sampling.

75. The system of claim 74, wherein said status and command information further comprises a specified RAM storage address location for the start of said storage of said data and said processor further comprises means for writing said data into said specified RAM storage address location.

76. The system of claim 75, wherein said processor further comprises means for repetitively sampling and storing of said data at the specified time intervals of said status and command information.

77. The system of claim 76, wherein said processor further comprises means for writing said repetitive samplings into successive sequential storage address locations in said RAM.

78. The system of claim 77, wherein said system further comprises a means for detecting the occurrence of a power outage and for providing back-up power to said RAM and to said clock/calendar during said outage.

79. The system of claim 78, wherein said means to provide back-up power comprises a capacitor-resistor network.

80. The system of claim 79, wherein said processor further comprises means for writing into said RAM the time and date of the occurrence of said power outage and the time and date of the restoration of power after a power outage.

81. The system of claim 80, wherein said processor further comprises means to write said time and date of the occurrence of power outage into the next sequential address location in said RAM and to write said time and date of the restoration of power into the address location sequentially following said next sequential address location.

82. The system of claim 81, wherein after a predetermined number of samplings of data have been stored in said RAM, said processor further comprises means to write into the next available address location of said RAM information which indicates whether a power outage has taken place during said predetermined number of samplings and if there has been a power outage, the address location of said time and date of the occurrence of said power outage.

83. The system of claim 82, wherein said means to communicate said data from said remote site to said central location and for communicating said status and command data from said control location to said remote site comprises a modem at said remote site, and a modem at said central location.

84. The system of claim 83, wherein said system comprises up to thirty-two of said sensors.

85. The system of claim 84, wherein said means to convert said analogue output into digital signals comprises an A to D converter.

86. The system of claim 85, wherein said central location further comprises means to request the transmission of said sampled data and power outage information stored in said RAM and said at least one remote site comprises means to transmit said sampled data and said power outage information to said central location.

87. The system of claim 86, wherein said remote site further comprises means to transmit said data and said power outage information to said central location in bytes.

88. The system of claim 87, wherein said remote site further comprises means to transmit to said central location status information for enabling said host computer to interpret said [blocks] *bytes* of data and power outage information.

89. The system of claim 88, wherein said status information further comprises the site processor identification number, the current time of its clock/calendar, said specified time and date for the processor to communicate with the host computer to transmit said data, the interval between samplings of the outputs of said sensors, the next available address in said RAM, and said time and date at which the site processor was put into its monitoring mode by the host computer.

90. A method for automatically and repetitively sampling and storing data representing the power usage of a plurality of power consuming devices at a remote site, with a processor using a random access memory (RAM) located at said remote site, and of communicating said data to a host computer, comprising the steps of:

(a) receiving, at said processor, status and command information from said host computer including data specifying the time and date at which said remote processor should initiate said sampling of said data, the time interval between samples of said data and the time and date at which said remote processor should report to, and communicating said sampled data directly to said host computer, using ordinary public telephone lines only, independent of any power transmission means;

(b) storing said status and command data in said RAM;

(c) sampling, at said time interval, the outputs of a plurality of power sensing devices, each of said sensors installed at a respective one of said plurality of devices and having an analogue output representing the power conservation of a respective one of said devices, converting said analogue output into digital form, and connecting said converted outputs to said remote processor at said time and date for initiating said sampling;

(d) storing said outputs in said RAM;

(f) sequentially storing each of said sequentially sampled outputs in said RAM: and (g) transmitting such said sampled output data from said processor to said host computer using ordinary public telephone lines only, independent of any power lines or means, at said specified reporting time and date.

91. The method of claim 90 including the additional steps of sequentially storing said sampled outputs in said RAM beginning at the storage address specified by said host computer in said status and command data.

92. The method of claim 91 including the additional steps of:

(a) storing in said RAM the time and date of each power outage and each power resumption at said remote site; and (b) transmitting said time and date of each power outage and each power resumption from said processor to said host computer with said sampled outputs.

93. The method of claim 92 including the additional steps of:

(a) detecting the start of the occurrence of a power outage;

(b) storing in said RAM, at the next sequential storage address, said power outage time and date;

(c) detecting said resumption of power after said power outage;

(d) storing in said RAM, at the next sequential storage address, said time and date of said power resumption; and (e) storing in said RAM information as to whether a power outage at said remote site has occurred during a predetermined number of said samplings and the storage address location of said power outage time and date.

94. The method of claim 91 including the additional step of transmitting from said processor directly to said host computer, using ordinary public telephone lines only, independent of any power transmission lines or means, on command from host computer, status information representing said time and date of initial sampling, said time interval between samplings, said reporting time and date, the next available storage address location in said RAM, and a flag storage address which is the address of a predetermined percentage of the total available storage addresses.

95. The method of claim 94 including the additional steps of:

(a) comparing the next available address in said RAM with said flag storage address in said remote processor; and (b) transmitting said sample data from said processor to said host computer when said next available storage address equals said flag address.

96. The method of claim 95 including the additional steps of:

(a) storing in said RAM the time and date of each power outage and each power resumption at said remote site; and (b) transmitting said time and date of each power outage and each power resumption from said processor to said host computer with said sampled output.

97. The method of claim 96 including the additional steps of:

(a) detecting the start of the occurrence of a power outage;

(b) storing in said RAM, in the next sequential storage address, said power outage time and date;

(c) detecting said resumption of power after said power outage;

(d) storing in said RAM, in the next sequential storage address, said time and date of said power outage; and (e) storing in said RAM information as to whether a power outage was occurred after a predetermined number of said samplings and the storage address location of said power outage time and date.

* * * * *